US005587791A

United States Patent [19]
Belleville et al.

[11] Patent Number: 5,587,791
[45] Date of Patent: Dec. 24, 1996

[54] OPTICAL INTERFEROMETRIC CURRENT SENSOR AND METHOD USING A SINGLE MODE BIREFRINGENT WAVEGUIDE AND A PSEUDO-DEPOLARIZER FOR MEASURING ELECTRICAL CURRENT

[75] Inventors: Claude Belleville, Saint-Jean-Chrysostome; Richard Van Neste; Serge Caron, both of Québec; Alain C. Houle, Lachenaie; Pierre Thibault, Boucherville, all of Canada

[73] Assignee: Citeq, Varennes, Canada

[21] Appl. No.: 313,690

[22] Filed: Sep. 27, 1994

[51] Int. Cl.$^6$ .............................. G01B 9/02; G02B 6/00
[52] U.S. Cl. .......................... 356/345; 356/350; 385/12
[58] Field of Search .................................. 356/345, 350; 250/227.27, 227.19; 385/12, 14

[56] References Cited

U.S. PATENT DOCUMENTS

| | | | |
|---|---|---|---|
| 4,370,612 | 1/1983 | Puech et al. | 324/117 |
| 4,372,685 | 2/1983 | Ulrich | 356/350 |
| 4,542,338 | 9/1985 | Arditty et al. | 324/117 |
| 4,545,682 | 10/1985 | Greenwood | 356/350 |
| 4,634,852 | 1/1987 | Shaw | 356/345 |
| 4,773,758 | 9/1988 | Shaw | 356/345 |
| 4,828,389 | 5/1989 | Gubbins et al. | 356/350 |
| 4,848,910 | 7/1989 | Dupraz | 356/350 |
| 4,949,038 | 8/1990 | Birch et al. | 324/244 |
| 5,321,503 | 6/1994 | Bramsor | 356/350 |

FOREIGN PATENT DOCUMENTS

| | | |
|---|---|---|
| 2251940 | 7/1992 | United Kingdom . |
| WO8300232 | 1/1983 | WIPO . |
| WO9313428 | 7/1993 | WIPO . |

OTHER PUBLICATIONS

Lefèvre, Hervé, The Fiber-Optic Gyroscope, "Photonetics", Artech House, Boston, London, 1990, pp. 58–101.

Blake, J., "Magnetic Field Sensitivity of Depolarized Fiber Optic Gyros", in SPIE, vol. 1367, Fiber Optic and Laser Sensors VIII, 1990, pp. 81–86.

Böhm, K., P. Marten, K. Petermann, E. Weidel and R. Ulrich, "Low-Drift Fibre Gyro Using a Superluminescent Diode", in Electronics Letters, vol. 17, No. 10, 14th May, 1981, pp. 352–353.

Clarke, Ian G., "Temperature-stable spun elliptical-core optical-fiber current transducer", in Optics Letters, vol. 18, No. 2, Jan. 15, 1993, pp. 158–160.

Burns, William K. and Alan D. Kersey, "Fiber-Optic Gyroscopes with Depolarized Light", in Journal of Lightwave Technology, vol. 10, No. 7, Jul. 1992, pp. 992–999.

Laming, Richard I. and David N. Payne, "Electric Current Sensors Employing Spun Highly Birefringent Optical Fibers", in Journal of Lightwave Technology, vol. 7, No. 12, Dec. 1989, pp. 2084–2094.

(List continued on next page.)

Primary Examiner—Samuel A. Turner
Assistant Examiner—Amanda Merlino
Attorney, Agent, or Firm—Darby & Darby

[57] ABSTRACT

The interferometric current sensor is for measuring an electrical current. It comprises a light source for generating a light beam; a single mode birefringent waveguide having a linear birefringence and a circular birefringence, the circular and linear birefringences having respectively given orders of magnitude, the order of magnitude of the circular birefringence being equal or higher than the order of magnitude of the linear birefringence, the waveguide having a first loop portion for encircling the electrical current; a beamsplitter having a first input port optically coupled to the light source, and second and third input/output ports optically coupled to ends of the waveguide for launching counter-propagating light beams into the respective ends of the waveguide and for receiving the counter-propagating light beams therefrom; and a pseudo-depolarizer optically coupled in series with the waveguide for converting each of the counter-propagating light beams into a predetermined ratio of useful counter-propagating light signals and useless counter-propagating light signals. It also comprises an optical detector optically coupled to the ends of the waveguide via the beamsplitter for detecting a light intensity, the light intensity is representative of the current.

19 Claims, 7 Drawing Sheets

OTHER PUBLICATIONS

Burns, William K., "Degree of Polarization in the Lyot Depolarizer", in Journal of Lightwave Technology, vol. LT–1, No. 3, Sep. 1983, pp. 475–479.

MacDougal, Trevor W., Dale R. Lutz and Robert A. Wandmacher, "Development of a Fiber Optic Current Sensor for Power Systems", in IEEE, pp. 336–341.

Veeser, L. R. and G. W. Day, "Faraday Effect Current Sensing Using a Sagnac Interferometer with a 3×3 Coupler", 1990.

In collaboration, "Optical Current Transducers for Power Systems: a Review", IEEE, 1994, (94 WM 241–0 PWRD), pp. 1–10.

Cease, T. W. and Paul Johnston, "A Magneto–Optic Current Transducer", in IEEE Transactions on Power Delivery, vol. 5, No. 2, Apr. 1990, pp. 548–555.

0 AMPERE

FIG. 4

0 AMPERE

OPTICAL INTERFEROMETRIC CURRENT SENSOR AND METHOD USING A SINGLE MODE BIREFRINGENT WAVEGUIDE AND A PSEUDO-DEPOLARIZER FOR MEASURING ELECTRICAL CURRENT

FIELD OF THE INVENTION

The present invention relates to an interferometric current sensor and a method for measuring an electrical current.

BACKGROUND OF THE INVENTION

The optical fibre interferometric current sensor relates to the field of electrical current measurement. In particular, this sensor is used for measuring electrical current in high voltage conductors. Generally, according to actual technology, measurements of electrical current in high voltage conductors are done by means of current transformers. These apparatuses are very expensive. Also, they cannot be mounted easily. Furthermore, these current transformers can explode in case of dielectric breakdown. Whereas optical fibre sensors are safe and less expensive while providing technical characteristics which are superior to the ones provided by current transformers. Among these technical characteristics, it can be mentioned that they are provided with a dynamic range superior to the one obtained with current transformer, with pass-band superior to the one of the current transformers and with a precision which is as good as the one provided with current transformers or superior. Also, optical fibre sensors are very light, compact and made of dielectric material. Accordingly, they can be easily mounted.

There are two families of optical fibre sensors. The first comprises the bulk type sensors based on the use of a block of glass, and the second comprises fibre sensors using an optical fibre not only for guiding light energy as it is the case with the bulk sensor, but also for the measurement itself. Certain bulk sensors have been developed to a point where they have reached a pre-commercialization state, whereas the optical fibre sensors are generally less developed.

Nevertheless, development of optical fibre sensors continues because these have possibilities which are superior to the ones of the bulk type sensors. More specifically, in certain conditions they can provide better precision and reliability. Also, they can be produced at a lower cost and they can be used in a broader range of applications.

The use of an optical fibre can be beneficial by encircling the conductor with several turns, to multiply the Faraday rotation by the number of turns. This is true for an ideal optical fibre but for a non-ideal optical fibre, the Faraday rotation is quenched because of the linear birefringence of the optical fibre. This problem should be solved by minimizing the quenching caused by the linear birefringence. A solution consists in using a high-birefringence spun fibre.

Sensors using standard optical fibres have problems. They are very sensitive to mechanical vibrations and to temperature variations. Certain groups of researchers seem to have solved the problem relating to temperature variations whereas other groups seem to have solved the problem relating to sensitivity to mechanical vibrations, but nobody has succeeded in solving these two problems at the same time.

Most optical current sensors are based on a phenomenon known as the Faraday effect. When a light beam is in the proximity of a magnetic field oriented along a direction parallel to the light beam propagation direction, then the two circular components of its polarization state are subjected to a phase-shift proportional to the intensity of the magnetic field. The polarity of this phase-shift depends on the direction of the magnetic field with respect to the direction of the light beam propagation. It is said that this phenomenon is non-reciprocal.

Several configurations based on glass bulk have been proposed in the literature. In this case, a block of glass is shaped as a ring around the conductor, and the light guided inside the block is subjected to a polarization rotation which is proportional to the electrical current. Nevertheless, the Faraday rotation caused by the presence of current is very weak. Also, the coded light signal is very weak.

The phase difference produced between the circular polarization components produced by the Faraday effect induces, for a linear polarization, a rotation $\Phi$ of the polarization plan equal to the half of the phase difference $2\Phi$ produced between the two circular polarization components. This is why this phenomenon is also known as the Faraday rotation. Along a propagation distance L, the phase difference $\Phi$ is calculated by means of the following equation:

$$\phi = \mu V \int_L \vec{H} \cdot \vec{dl}$$

where H is the magnetic field vector, $\mu$ is the permeability constant and V is the Verdet constant which is representative of the sensitivity of the medium to the Faraday effect. According to Ampere's law, the magnetic field integrated along a closed loop depends only on the current I circulating inside the loop where I is defined according to the following equation:

$$\oint \vec{H} \cdot \vec{dl} = I$$

Thus, by circulating an optical beam along a closed loop path around an electrical conductor by means of an optical fibre, it is possible to know the amplitude of the electrical current by measuring the phase difference $2\Phi$ produced between the right and left circular components of the polarization according to the following equation:

$$\phi = \mu V N I$$

where N is the number of complete turns done by the light beam around the electrical conductor.

A certain degree of birefringence is always present in an optical fibre. This birefringence can be intrinsic or extrinsic. The intrinsic birefringence results from the characteristic of the fibre due to its manufacturing process. The extrinsic birefringence results from ambient conditions surrounding the fibre such as the temperature, the strain and the vibration. The linear birefringence present in the fibre produces a quenching of the phase difference between the circular polarization components (the Faraday rotation) resulting from the Faraday effect.

The optical fibre which will be used in the present invention is known in the art as a high birefringent spun optical fibre (spun fibre). Such a fibre has high linear and circular birefringences. Because of this double characteristic, this fibre is less sensitive to changes in ambient conditions than a low intrinsic birefringence fibre while maintaining a good sensitivity to electrical current. This fibre is known as spun fibre because during its manufacturing process, the preform is axially rotated during its drawing into a fibre.

However, the optical fibre itself is not sufficient for measuring electrical current with good results. Several configurations of optical fibre interferometric current sensor using the high-birefringence spun fibre have been experimented. The sensor has to be designed in such a way that the mechanical vibrations and the temperature variations do not affect the current reading. The Faraday rotation in a high-birefringence spun fibre is always present. Nevertheless, the linear and circular birefringences of the optical fibre also affect the polarization state of the light guided through the optical fibre. As the mechanical vibrations and the temperature variations affect the linear and circular birefringences, the polarization and the phase are also affected. From that, it is clear that the current reading will be dependent upon temperature variations and mechanical vibrations which can have a greater influence than the Faraday rotation itself. This is the problem to be solved.

This problem should be solved by taking into consideration a specific characteristic of the Faraday effect, the non-reciprocity. This means that the Faraday rotation of the light circulating through an optical fibre from point A to point B, and then inversely from point B to point A is cumulative as there is no reciprocity. On the other hand, the circular and linear birefringences are reciprocal. This means that rotation of the light circulating through an optical fibre from point A to point B, and then inversely from point B to point A is cancelled as there is reciprocity. Then, the effect of the circular and linear birefringences, under certain conditions is cancelled. From that, it is possible to obtain insensitivity to mechanical vibrations and temperature variations. These conditions are filled if the path of the light circulating in both directions is reciprocal, it means that both counter-propagating light beams follow similar reciprocal paths. It is believed that there is no configuration in the prior art that satisfies the condition mentioned above. With reciprocal paths, it is possible to compensate signal variations resulting from vibrations or mechanical strains applied to the fibre.

Several embodiments using the spun fibre have been proposed for measuring electrical current. In the International PCT application No. WO 83/00232 of PAYNE et al., the use of an orthoconjugated mirror disposed at the end of a spun fibre is suggested. The light is injected at an end, is guided along the fibre and is reflected again inside the fibre. The reflected light is detected after its return course along the fibre by means of a polarizing prism. The orthoconjugated mirror reflects the light so that it follows a reciprocal path in both directions along the fibre.

But, orthoconjugated mirrors, upon which depends the stability of the whole system, are themselves sensitive to temperature variations and to magnetic field. Accordingly, reciprocal paths using an orthoconjugated mirror do not solve the problems relating to temperature variations.

Also known in the art, is the Sagnac interferometer. In such interferometers, two counter-propagating light beams are injected into the two opposite ends of the same optical fibre by means of input/output ports of a coupler. Said optical fibre encircles the electrical conductor through which circulates the electrical current to be measured. This coupler is also used for recombining the counter-propagating light beams on the return thereof. If these counter-propagating light beams follow reciprocal paths, the phase difference induced by the optical fibre is nil. As the Faraday effect is non-reciprocal, the presence of a magnetic field will induce a positive phase difference between circular polarization components for a light beam circulating along a given direction, and a negative phase difference for the other light beam which is counter-propagating. Thus, the phase difference between the light beams, after recombination at the coupler, is dependent only upon the Faraday effect and therefore it is dependent upon the electrical current circulating through the conductor. A variation of the phase difference between the two counter-propagating light beams modifies the interfering conditions during the recombination at the coupler. Resulting from that is a variation of the light intensity distribution reflected in input/output ports of the coupler according to the following equations:

$$P_1 = \cos^2(\mu VNI) P_c$$

$$P_2 \approx \cos^2(\mu VNI + (\pi/2)) P_0$$

where $P_1$ and $P_2$ are the light intensity signals detected respectively in the output ports of the coupler, and $P_0$ is the light intensity signal injected in the Sagnac interferometer.

Thus, the amplitude of the current can be known by measuring light intensity signals reflected back in the output ports of the coupler. If the light beams follow similar reciprocal paths, the phase difference depends only upon the Faraday effect. In practice, the light beams do not always follow similar reciprocal paths. Consequently, the phase difference does not depend only upon the Faraday effect. As a matter of fact, the birefringence present in the optical fibre may result in guiding the two light beams into different paths. Because of that, the phase difference between the polarization components of the light beams is affected. Also, as the birefringence is sensitive to temperature variations and mechanical vibrations, the output signal will be unstable. The polarization and the phase difference between the two counter-propagating light beams are independent from the birefringence only if the two light beams follow similar reciprocal paths. It would be possible to obtain an interferometric current sensor perfectly insensitive to mechanical vibrations and to temperature variations only if the two counter-propagating light beams follow similar reciprocal paths.

In the International PCT application NO. WO 93/13428 of CLARKE there is described a Sagnac interferometer for measuring electrical current. CLARKE proposes the use of a high-birefringence spun fibre with a Sagnac interferometer. The object of the CLARKE patent application is to reduce the influence of temperature variations on electrical current readings. This configuration exploits the reciprocity of circular and linear birefringences. This reciprocity is obtained only if the light beam circulating in the clockwise direction along the Sagnac loop and the light beam circulating in the counter-clockwise direction along the Sagnac loop follow similar reciprocal paths. In order to obtain that, the angle between the polarization axes of the high-birefringence spun fibre sections and the optical fibres connected to the coupler must be carefully adjusted so that the counter-propagating light beams follow similar reciprocal paths. Also, the optical fibres connecting the coupler to the high-birefringence spun fibre sections must have a negligible birefringence. Thus, as long as the birefringence of optical fibres connecting the coupler to the Hi-Bi spun fibre is not affected by temperature variations, the configuration proposed by CLARKE provides reciprocal paths with respect to temperature, and therefore a good stability with respect to temperature can be obtained. But, as for stability with respect to mechanical vibrations, CLARKE proposes no solution to this problem. As a matter of fact, in presence of mechanical vibrations, the high-birefringence spun fibre sections and the optical fibres connected to the coupler are affected in a non-uniform manner. Because of that, the paths of the counter-propagating light beams are partially non-reciprocal and therefore the whole system is sensitive to mechanical vibrations. Because of that, a part of the light energy which varies with respect to mechanical vibrations, does not interfere according to the phase difference induced by the Faraday effect, the resulting signal is then unstable. The configuration proposed by CLARKE does not solve the problems related to mechanical vibrations.

certain interferometric current sensors of this kind use active elements such as phase and amplitude modulators, outside and/or inside the Sagnac loop to reduce the sensitivity of the sensor to ambient conditions. But, the complexity of the whole system is increased.

Also known in the art, there are the following patents and articles relating to different apparatuses using optical fibres for measuring different parameters:

U.S. Pat. Nos. 4,370,612 4,542,338 4,545,682 4,634,852 4,773,758 4,848,910 4,949,038

U.K. Patent Application No. 2,251,940

Publications:

Low-Drift Fibre Gyro Using A Superluminescent Diode of Böhm et al., ELECTRONICS LETTERS, May 14, 1981, Vol. 17, No. 10, pages 352–353;

Electric Current Sensors Employing Spun Highly Birefringent Optical Fibers, Richard I. LAMING et al., Journal of Lightwave Technology, Vol. 7, No. 12, December 1989, pages 2084 to 2094;

Degree of Polarization in the Lyot Depolarizer, William K. BURNS, Journal of Lightwave Technology, Vol. LT-I, No. 3, September 1983, pages 475 to 479;

Temperature-Stable Spun Elliptical-Core Optical-Fiber Current Transducer, Ian G. CLARKE, Optics Letters, Vol. 18, No. 2, Jan. 15, 1993, pages 158 to 160;

Development of a Fiber Optic Current Sensor for Power Systems, Trevor W. MacDOUGALL et al., Proceedings of 1991 IEEE Power Engineering Society Transmission and Distribution Conference, pages 336 to 341;

Magnetic Field Sensitivity of Depolarized Fiber Optic Gyros, J. BLAKE, SPIE, Vol. 1367, Fiber Optic and Laser Sensors VIII (1990), pages 81 to 86;

Fiber-Optic Gyroscopes with Depolarized Light, William K. BURNS et al., Journal of Lightwave Technology, Vol. 10, No. 7, July 1992, pages 992 to 999;

Faraday Effect Sensors: The State of the Art, G. W. DAY et al., SPIE, Vol. 985 Fiber Optic and Laser Sensors VI (1988), pages 138 to 150;

Faraday Effect Current Sensing Using a Sagnac Interferometer with a 3×3 coupler, presented at Optical Fibre Sensors Conference 1990, R. R. VESSER et al.;

Optical Current Transducers for Power Systems: A review by the Emerging Technologies Working Group for presentation at IEEE/PES 1994 Winter Meeting, pages 1 to 11;

The Fiber-Optic Gyroscope, Hervé LEFÈVRE, published by Artech House (Boston), pages 58 to 62, 73 to 86, 93 to 101; and A Magneto-Optic Current Transducer, T. W. CEASE et al., IEEE Transactions on Power Delivery, Vol. 5, No. 2, April 1990, pages 548 to 555.

OBJECT OF THE INVENTION

The main object of the present invention is to propose an interferometric current sensor and a method for measuring an electrical current, which are at the same time less sensitive to mechanical vibrations and temperature variations than the interferometric current sensor known in the art.

SUMMARY OF THE INVENTION

According to the present invention, there is provided an interferometric current sensor for measuring an electrical current, said sensor comprising:

a light source for generating a light beam;

a single-mode birefringent waveguide having a linear birefringence and a circular birefringence, said circular and linear birefringences having respectively given orders of magnitude, the order of magnitude of said circular birefringence being equal or higher than the order of magnitude of said linear birefringence, said waveguide having a portion for encircling said electrical current;

a beamsplitter having a first input port optically coupled to said light source, and second and third input/output ports optically coupled to ends of said waveguide for launching counter-propagating light beams into the respective ends of the waveguide and for receiving said counter-propagating light beams therefrom;

a pseudo-depolarizer optically coupled in series with said waveguide for converting each of said counter-propagating light beams into a predetermined ratio of useful counter-propagating light signals and useless counter-propagating light signals; and an optical detector optically coupled to the ends of said waveguide via said beamsplitter for detecting a light intensity, said light intensity resulting from an interference of useful counter-propagating light signals and useless counter-propagating light signals, whereby said light intensity is representative of said current.

Also, according to the present invention, there is provided a method for measuring an electrical current, said method comprising steps of:

a) encircling said electrical current by means of a loop portion of a single-mode birefringent waveguide, said waveguide having a linear birefringence and a circular birefringence, said circular birefringence and linear birefringences having respectively given orders of magnitude, the order of magnitude of said circular birefringence being equal or higher than the order of magnitude of said linear birefringence;

b) generating a light beam;

c) splitting said light beam to launch two counter-propagating light beams into respective ends of said waveguide;

d) pseudo-depolarizing said two counter-propagating light beams launched into said waveguide to convert each of said counter-propagating light beams into a predetermined ratio of useful and useless light signals;

e) interfering said useful counter-propagating light signals and useless counter-propagating light signals to produce an interfered light signal; and f) optically detecting a light intensity of said interfered light signal, whereby said light intensity is representative of said current.

The objects, advantages and other features of the present invention will become more apparent upon reading of the following non-restrictive description of preferred embodiments thereof, given for the purpose of exemplification only with reference to the accompanying drawings.

DETAILED DESCRIPTION OF THE DRAWINGS

According to the present invention, there is proposed an interferometric current sensor which is insensitive to mechanical vibrations and temperature variations. This interferometric current sensor is characterized by having an optical fibre pseudo-depolarizer located in a Sagnac loop.

This pseudo-depolarizer acts on a light beam having a not-nil bandwidth by converting the different spectral components into different polarization states at its output. The light, at the output of the pseudo-depolarizer, averaged along the whole spectrum seems to be depolarized, but each wavelength taken individually is still polarized. The polarization state varies in relation to the wavelength. This phenomenon is known as pseudo-depolarization, which means that it is not a random process. This is different from perfect depolarization where the polarization state at each wavelength is random. In the present case, it is important to obtain a pseudo-depolarization, since there is always a phase relation between the input light and the output light.

Figure 1:
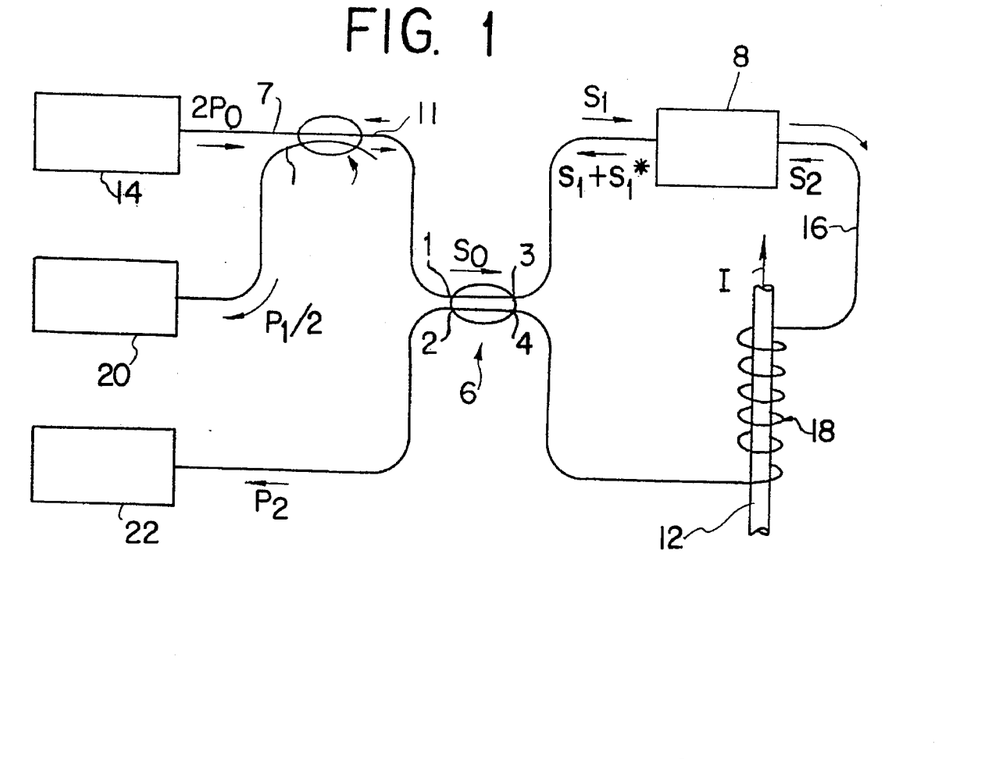
FIG. 1 is a schematic diagram illustrating an interferometric current sensor in accordance with the present invention.

Referring now to FIG. 1, there is shown an interferometric current sensor for measuring an electrical current I according to the present invention. It comprises a light source 14 for generating a light beam, and a single-mode birefringent waveguide 16 having a linear birefringence and a circular birefringence. The circular and linear birefringences have respectively given orders of magnitude, the order of magnitude of the circular birefringence being equal or higher than the order of magnitude of the linear birefringence. The waveguide 16 has a first loop portion 18 for encircling an electrical conductor 12 through which circulates the electrical current I.

The sensor also comprises a beamsplitter 6 having a first input port 1 optically coupled to the light source 14, and second and third input/output ports 3 and 4 optically coupled to ends of the waveguide 16 for launching counter-propagating light beams into the respective ends of the waveguide 16 and for receiving the counter-propagating light beams therefrom; and a pseudo-depolarizer 8 optically coupled in series with the waveguide 16 for converting each of the counter-propagating light beams into a predetermined ratio of useful counter-propagating light signals and useless counter-propagating light signals.

The sensor also comprises optical detector units 20 and 22 optically coupled to the ends of the waveguide 16 via the beamsplitter 6 for detecting light intensities. The light intensities resulting from an interference of useful counter-propagating light signals and useless counter-propagating light signals are representative of the current I. For certain applications, the use of a single optical detector unit 20 or 22 is sufficient for determining the amplitude of the current I within a given range.

The beamsplitter 6 has a fourth output port 2 for connection to the second detecting unit 22. The first input port 1 is an input/output port. The sensor further comprises an injection coupler 10 for optically coupling the source 14 and the detecting unit 20 to the beamsplitter 6. The injection coupler 10 has an input port 7 connected to the source 14, an output port 9 connected to the first detecting unit 20 and an input/output port 11 connected to the first input/output port 1 of the beamsplitter 6.

The single-mode birefringent waveguide 16 is a spun fibre. The beamsplitter 6 with the single-mode birefringent waveguide 16 forms a Sagnac interferometer.

Figure 2:
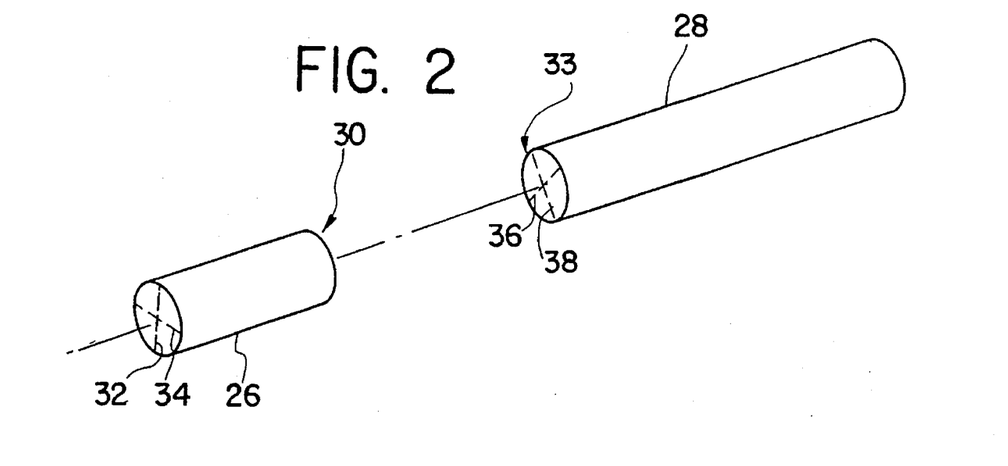
FIG. 2 is a schematic diagram illustrating how to produce a pseudo-depolarizer.

Referring now to FIGS. 1 and 2, the source 14 is characterized by a spectral distribution having a central frequency equal to $v_0$ and a spectral frequency full-width equal to $\delta v$ at half maximum. The light beam generated by the source 14 has a coherence length $L_c$ equal to $c/\delta v$ where c is the velocity of light in vacuum. The pseudo-depolarizer 8 is a Lyot depolarizer comprising a first highly birefringent fibre 26 having a high birefringence $\Delta\beta_1$, a length $L_1$, polarization axes 32 and 34 and a depolarization length $L_{d1}$ defined by the following equation:

$$L_{d1} = \frac{c^*L_1}{2\pi} \left( \frac{d\Delta\beta_1}{dv} \right)\bigg|_{v=v_0}$$

the depolarization length $L_{d1}$ being greater than $L_c$.

The pseudo-depolarizer also comprises a second highly birefringent fibre 28 having a high birefringence $\Delta\beta_2$, a length $L_2$, polarization axes 36 and 38 and a depolarization length $L_{d2}$ defined by the following equation:

$$L_{d2} = \frac{c^*L_2}{2\pi} \left( \frac{d\Delta\beta_2}{dv} \right)\bigg|_{v=v_0}$$

the $L_{d2}$ being equal to or higher than said $2L_{d1}$.

The first highly birefringent fibre 26 has an end 30 connected to an end 33 of the second highly birefringent fibre 28 in such a manner that the polarization axes 32 and 34 are rotated of 45° from the polarization axes 36 and 38.

As for example, the source 14 is characterized by spectral distribution having a central frequency equal to $v_0$ and a spectral frequency full-width equal 2500 gigahertz (5 nanometers in wavelength). There are other types of pseudo-depolarizers that can be used in accordance with the present invention. Among others, Lutz proposes a pseudo-depolarizer based on a loop interferometer comprising a polarization maintaining 2×2 fibre optic coupler, where one of the input ports is connected to the corresponding output port. The light beam generated by the source 14 has a coherence length $L_c$ equal to c/2500 gigahertz where c is the velocity of light in vacuum.

As for example, the light beam generated by the source has substantially a wavelength of 780 nanometers or 820 nanometers.

Referring now to FIG. 2, there is shown how it is possible to realize a pseudo-depolarizer with two sections 26 and 28 of high birefringence fibre also known as Hi-Bi fibres. One of the Hi-Bi fibre section 26 has a depolarization length equal or superior to the coherence length of the light source 14. The other Hi-Bi fibre section 28 has a depolarization length equal or longer than two times the length of the first fibre section 26. The two Hi-Bi fibre sections 26 and 28 are spliced together so that their birefringent axes 32,34 and 36,38 are rotated with respect to one another by an angle of 45°. This type of pseudo-depolarizer is known as Lyot pseudo-depolarizer.

Referring now to FIG. 1, the presence of a pseudo-depolarizer 8 in the Sagnac loop essentially allows that half of the light energy injected into the loop follows reciprocal paths. In the coupler 6, the light is in a polarization state $S_0$. The clockwise counter-propagating light beam evolves into a polarization state $S_1$ at the clockwise entrance port of the pseudo-depolarizer 8 whereas the other counter-propagating light evolves into a polarization state $S_2$ at the counter-clockwise entrance port of the pseudo-depolarizer 8. During the passage of the light beam through the pseudo-depolarizer 8, the pseudo-depolarizer 8 distributes the polarization along a continuum of polarization states. Thus, the polarization state becomes a function which varies according to the wavelength. The light, taken along the whole bandwidth, is then pseudo-depolarized.

For each wavelength, it is possible to break up the polarization state into a coherent addition of two polarization states which are orthogonal with one another. Thus, for the clockwise direction, the output of the pseudo-depolarizer 8 can be broken up into an addition of two orthogonal states $S_2$ and $S_2^*$, the energy, taken on the whole spectrum, is distributed in equal parts between these two polarization states $S_2$ and $S_2^*$. In a similar manner, the counter-clockwise direction output of the pseudo-depolarizer 8 can be broken up into the polarization states $S_1$ and $S_1^*$. Because of the reciprocity, the component $S_2$ of the light circulating along the clockwise direction becomes $S_0$ at the coupler 6 and the component $S_1$ of the light circulating along the counter-clockwise direction becomes also $S_0$ at the coupler.

Thus, a part of the light polarized according to $S_1$ and $S_2$ is found on both sides of the pseudo-depolarizer 8 and forms a useful light signal. This useful light signal interferes completely in the coupler 6 because it has followed reciprocal paths in both directions. More explicitly, the useful light signal follows the path $S_0$-$S_1$-$S_2$-$S_0$ in the clockwise direction and $S_0$-$S_2$-$S_1$-$S_0$ in the counter-clockwise direction. Thus, half of the light energy follows reciprocal paths and interferes completely in the coupler 6. Consequently, only the non-reciprocal phase difference induced by the Faraday effect will have an effect on the interference.

As for the components $S_2^*$ and $S_1^*$, they follow different paths. Because they follow different paths in opposite directions, it is said that they are non-reciprocal with respect to one another. The phase relationship between the counter-propagating light beams of this half of the light which is called non-useful light signal is different for each wavelength. Because these components are non-reciprocal and follow paths which are sufficiently different, they lose their coherence. During the interference at the coupler 6, the intensities of these two non-useful light beams will be distributed over the ports 1 and 2 of the coupler 6 to produce a constant amplitude. This constant amplitude will be added to the coherent interference produced by the useful component of the light signal and corresponds to half of the energy injected into the Sagnac loop.

When the ambient conditions such as temperature, pressure or mechanical vibration change, the reciprocal path changes. The effect of the pseudo-depolarizer 8 in the Sagnac loop results in a self-compensation for these changes. This compensation results from the fact that the useful light signal will be made of a different part of the light signal and the non-useful light signal will be made of a different part of the light. But, each part, useful or non-useful always corresponds to half of the injected energy. As a result, the interferometric current sensor is insensitive to ambient conditions such as mechanical vibrations and temperature variations.

Figure 3:
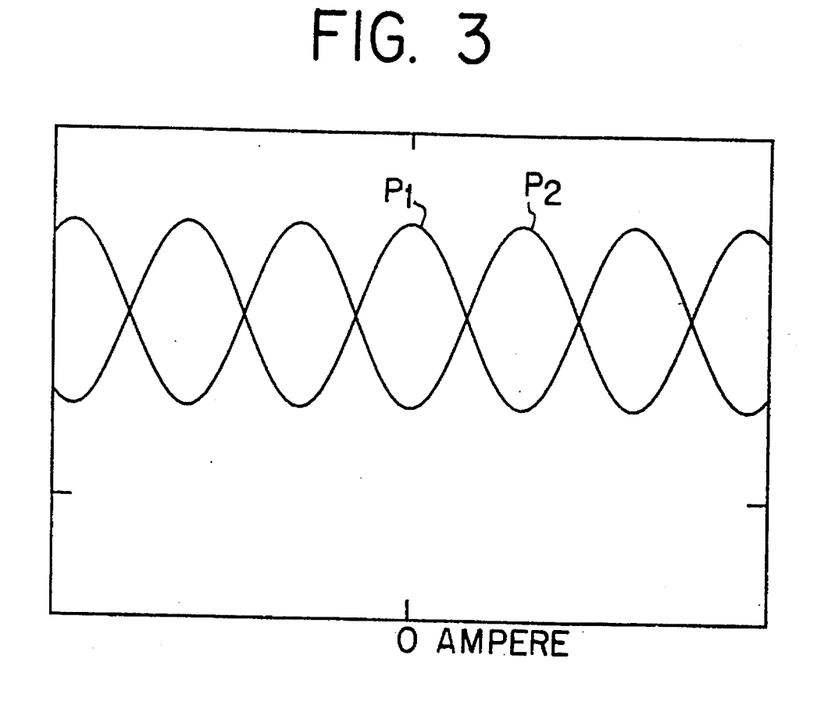
FIG. 3 is a diagram showing amplitudes of light intensities $P_1$ and $P_2$ with respect to current in relation to FIG. 1.

The light intensity signal $P_1$ detected from port 1 of the coupler 6 is determined by the following equation:

$$P_1=(\tfrac{1}{4})[1+2\cos^2(\mu VNI)]P_0$$

and the light intensity signal $P_2$ detected from port 2 of the coupler 6 is determined by the following equation:

$$P_2=(\tfrac{1}{4})[1+2\cos^2(\mu VNI-(\pi/2))]P_0$$

where $P_0$ is the power of the light signal injected into the port 1 of the coupler 6 and where $P_0=P_1+P_2$. The difference between the signals $P_1$ and $P_2$ can be understood because a phase-shift is produced when the light is coupled from one channel of the coupler to the other channel. The signals $P_1$ and $P_2$ are shown in FIG. 3. The vertical axis is proportional to the light intensity and the horizontal axis is proportional to the current I.

The sensor shown in FIG. 1 uses a 2×2 coupler 6 but a 3×3 can be used as well.

This configuration is an improvement over the prior art as explained above. But, on the one hand, the slope of the signal at one of the ports 1 or 2 of the coupler 6 is nil when the current is nil, which reduces the response of the sensor; and, on the other hand, the signals $P_1$ and $P_2$ are symmetrical on both sides of a nil current, which results in that it is not possible to determine the polarity of the current.

As it has been said above, the interferometric current sensor according to the present invention is characterized in such a way that it is insensitive to mechanical vibrations and temperature variations. It can be seen that the whole assembly is similar to the one proposed by CLARKE but it further comprises a pseudo-depolarizer 8 mounted in the Sagnac loop and does not require an alignment procedure at the output of the coupler. Because of this pseudo-depolarizer 8, it is possible to obtain similar reciprocal paths for the counter-propagating light beams even in the presence of mechanical vibrations and/or temperature variations. As a matter of fact, because of this pseudo-depolarizer 8, half of the light energy, and always only half, follows reciprocal paths, whereas the other half does nut follow reciprocal paths. If the optical fibre is affected by the occurrence of mechanical vibrations and/or temperature variations, the energy distribution with respect to the wavelength following reciprocal paths will be redistributed and the reciprocal paths themselves will be modified but the ratio of energy following the reciprocal paths will be always half of the total energy. As for the half of energy which does not follow reciprocal paths, there will be no longer coherence which will result in an averaging of the signal so that a constant light intensity will be produced during the recombination at the coupler. The use of a pseudo-depolarizer 8 combined with a high-birefringence optical spun fibre 16 in the Sagnac configuration has never been proposed.

According to the present invention, a method for measuring a first electrical current is proposed. It comprises the steps of (a) encircling the first electrical current by means of a first loop portion of a single-mode birefringent waveguide, the waveguide having a linear birefringence and a circular birefringence, the circular birefringence and linear birefringence having respectively given orders of magnitude, the order of magnitude of the circular birefringence being equal or higher than the order of magnitude of the linear birefringence; (b) generating a light beam; (c) splitting the light beam to launch two counter-propagating light beams into respective ends of the waveguide; (d) pseudo-depolarizing the two counter-propagating light beams launched into the waveguide to convert each of the counter-propagating light beams into a predetermined ratio of useful and useless light signals; (e) interfering the useful counter-propagating light signals and useless counter-propagating light signals to produce an interfered light signal; and (f) optically detecting a light intensity of the interfered light signal, whereby the light intensity is representative of the current.

Preferably, according to the embodiment shown in FIG. 1, the method is characterized in that the step (e) comprises the step of interfering the useful counter-propagating light signals and useless counter-propagating light signals to produce respectively two interfered light signals from the ends of the waveguide; and the step (f) comprises the step of optically detecting respectively light intensities of the interfered light signals, whereby the light intensities are representative of the current.

Figure 7:
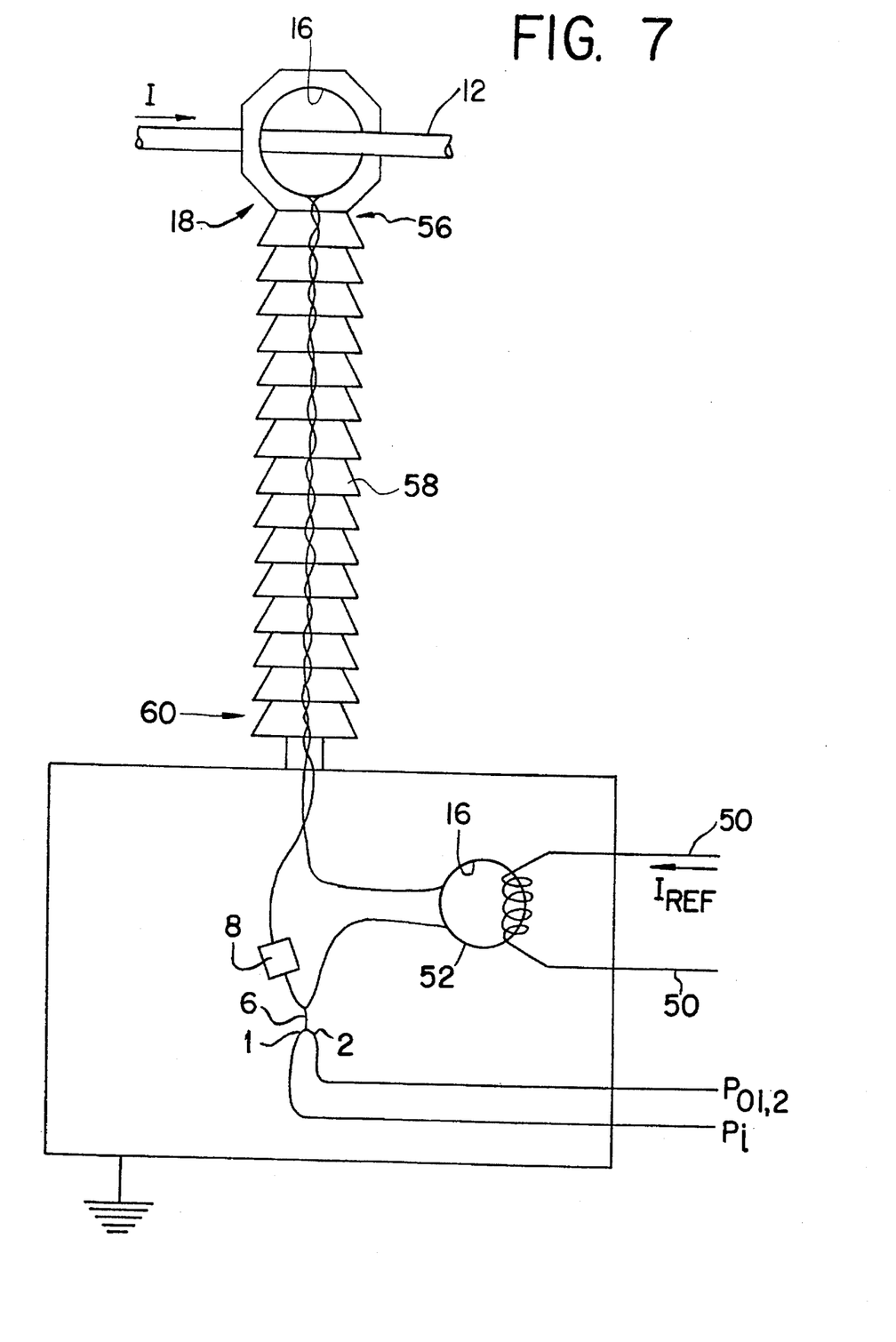
FIG. 7 is a schematic diagram showing another interferometric current sensor according to the present invention.

Referring now to FIG. 7, there is shown another embodiment of the present invention. It further comprises an electrical conductor 50 for inducing a bias phase difference between polarization components of the counter-propagating light beams, by circulating a reference current $I_{REF}$ around a section of a second loop portion 52 of the waveguide 16. The second loop portion 52 is in series with the first loop portion 18, whereby the light intensity is now also representative of polarity of the electrical current I.

The first loop portion 18 of the waveguide 15 is for encircling a high voltage conductor 12 through which circulates the first electrical current I, the high voltage conductor 12 being mounted at an upper end 55 of a vertical insulator 58. The beamsplitter 6 and the second loop portion 52 are mounted at a lower end 60 of the insulator 58.

Preferably, according to the embodiment shown in FIG. 7, the method is characterized in that, before step (e), it comprises the step of inducing a bias phase difference between polarization components of the counter-propagating light beams by circulating a second current which is the reference current $I_{REF}$ around a section of the second loop portion 52 of the waveguide 15. The second loop portion 52 is in series with the first loop portion 18, whereby the light intensity detected in step (f) is now also representative of polarity of the first electrical current I.

The second loop portion 52 detects the reference current $I_{REF}$ that produces an effect which is optically added to the one resulting from the effect of the current I on the first loop portion 18. With the embodiment shown in FIG. 7, it is possible to determine the current polarity of current I, and to make more uniform the sensitivity of the sensor.

Also, with this embodiment, it is possible to measure the current I by means of a quadrature technique to improve the resolution and the dynamic bandwidth of the sensor. But with this embodiment, there is a minor drawback which is that there is now a galvanic link between the station (not shown) adjacent to the insulator from which is supplied the reference current $I_{REF}$, and the sensor. It is believed that for many applications this drawback is acceptable since actual magnetic technology also requires such link. In practice, the conductor 50 could be included in a cable which would also include the optical fibres.

Figure 8A:
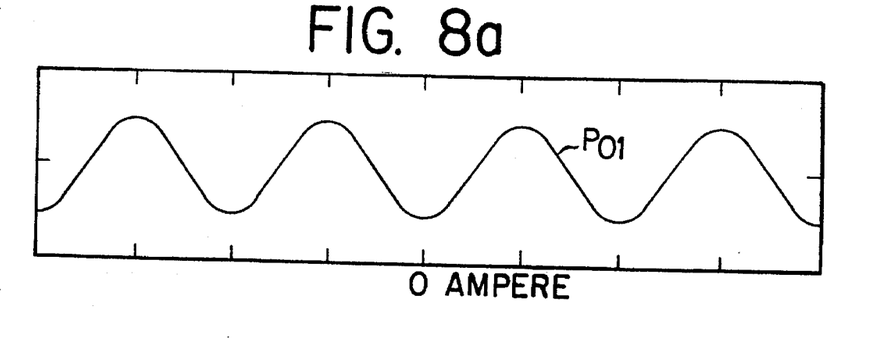
FIGS. 8a) and 8b) are diagrams showing respectively output signals of the sensor of FIG. 7 in two different operating conditions.
Figure 8B:
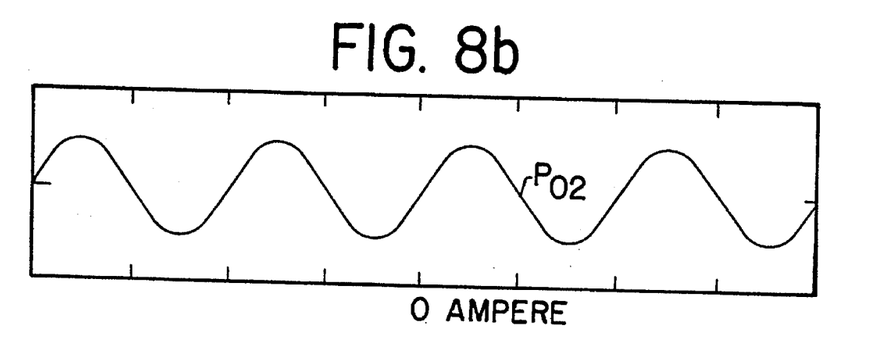

When the sensor is used without any reference current, its transfer function is symmetrical with respect to a zero current as shown in FIG. 8a which shows output signal $P_{01}$ with respect to the measured current I. Also, its sensitivity is very low for currents which are close to the origin. The injection of a reference current through the second loop portion results in a phase-shifting of the transfer function so that it become asymmetrical with respect to a zero current value as shown in FIG. 8b which shows output signal $P_{02}$ with respect to the measured current I. It is then possible to identify the polarity of the measured current while obtaining a good sensitivity for low currents.

Figure 9:
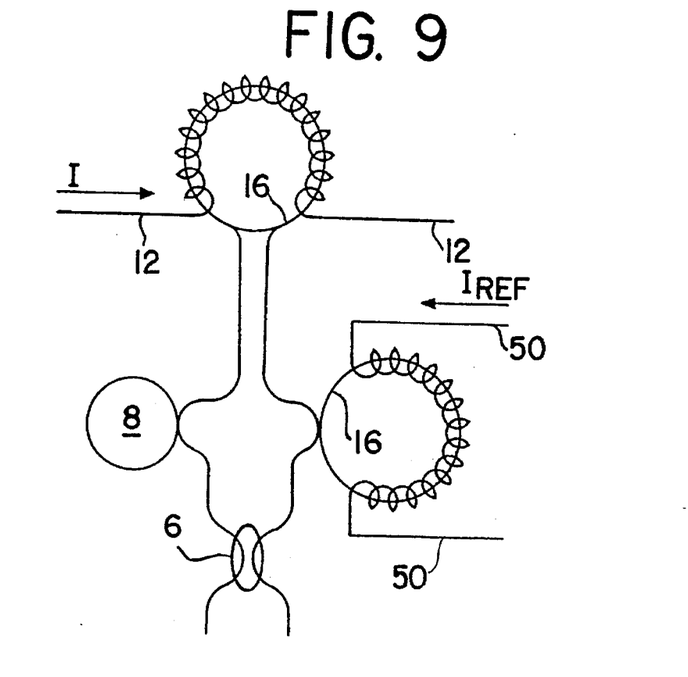
FIG. 9 is a schematic diagram showing a typical configuration of the sensor according to the present invention.

Referring now to FIG. 9, there is shown a schematic view of a typical configuration of the sensor. Preferably, the amplitude of the reference current should be such that the transfer function of the censor be phase-shifted of one quarter of a period. It does not matter whether the phase-shifting of the transfer function is leading or lagging.

Considering now a case where the period of the sensor's transfer function is a current having an amplitude $I_P$, the conductor 12 has $N_{CP}$ turns around the first loop portion, the conductor 50 has $N_{CS}$ turns around the second loop portion, the first loop portion is made of $N_{BP}$ turns of Hi-Bi spun fibre and the second loop portion is made of $N_{BS}$ turns of the same type of fibre. The coupler 6 is a two by two coupler and the pseudo-depolarizer is a Lyot pseudo-depolarizer 8. In this case, the amplitude of the reference current $I_{REF}$ is defined by the following equation:

$$I_{REF} = \frac{1}{4} \frac{N_{BP} N_{CP} I_P}{N_{BS} N_{CS}}$$

Figure 10:
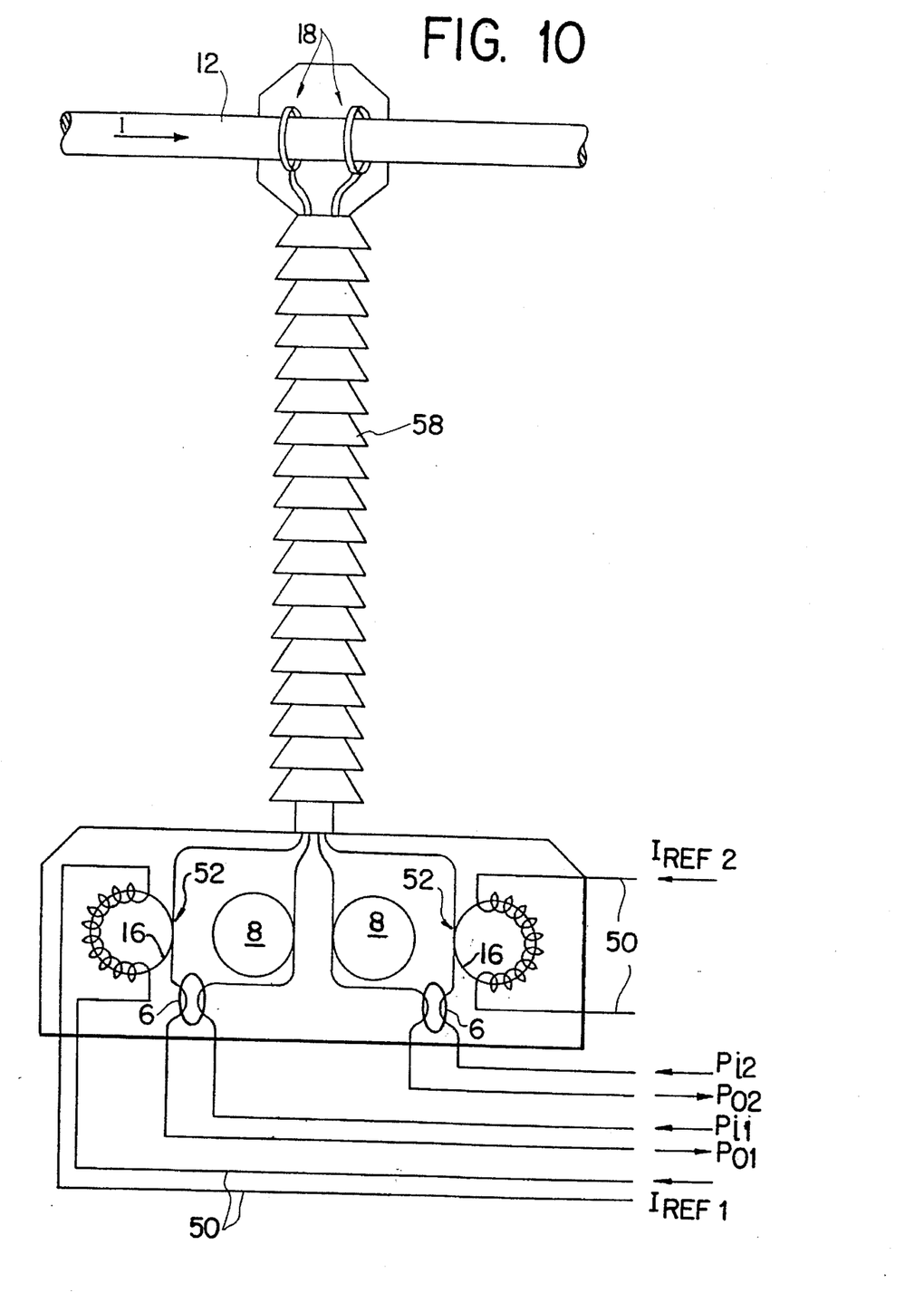
FIG. 10 is a schematic front view of an installation provided with a preferred embodiment of the present invention.

Referring now to FIG. 10, there is shown the use of a sensor comprising two sensing units which allow the measurement of the current I by means of a quadrature technique using a DC reference current. The second sensing unit is similar to the first one, it comprises:

a second light source (not shown in FIG. 10 but it is similar to the one shown in FIG. 1) for generating a second light beam;

a second single-mode birefringent waveguide 16 having a linear birefringence and a circular birefringence, the circular and linear birefringence of the second waveguide having respectively given orders of magnitude, the order of magnitude of the circular birefringence of the second waveguide 16 being equal or higher than the order of magnitude of the linear birefringence of the second waveguide 16, the second waveguide 16 having a third loop portion 18 for encircling the electrical current I;

a second beamsplitter 6 having a first input port optically coupled to the second light source, and second and third input/output ports optically coupled to ends of the second waveguide 16 for launching second counter-propagating light beams into the respective ends of the second waveguide 16 and for receiving the second counter-propagating light beams therefrom;

a second pseudo-depolarizer 8 optically coupled in series with the second waveguide 16 for converting each of the second counter-propagating light beams into a predetermined ratio of second useful counter-propagating light signals and second useless counter-propagating light signals;

a second optical detector (not shown in FIG. 10 but it is similar to the one shown in FIG. 1) optically coupled to the ends of the second waveguide 16 via the second beamsplitter 6 for detecting a second light intensity, the second light intensity resulting from an interference of the second useful counter-propagating light signals and second useless counter-propagating light signals, whereby the second light intensity is also representative of the current I; and a second electrical conductor 50 for inducing a bias phase difference between polarization components of the second counter-propagating light beams by circulating a second reference current around a section of a fourth loop portion 52 of the second waveguide 16, the fourth loop portion 52 being in series with the third loop portion 18.

The current I is in the order of 4 kA rms symmetrical, nominal frequency of 60 Hz, and asymmetrical crest 140 kA. Each of the first loop portions 18 is made of sixty turns of Hi-Bi spun fibre. This fibre is single-mode at 780 nm, has a beat length in the order of 10 mm before spinning and has a spin pitch of approximately 10 mm.

Each of the second loop portions 52 is made of 120 turns of Hi-Bi spun fibre. This fibre is single-mode at 780 nm, has a beat length in the order of 10 mm before spinning and has a spin pitch of approximately 10 mm.

The insulator is for a voltage of 765 kV with a basic impulse insulation level of 2100 kV. The insulator comprises a minimum of four fibres which are single-mode at 780 nm.

The pseudo-depolarizers are Lyot pseudo-depolarizers made of elliptical core birefringent fibres which are single-mode at 780 nm and have a beat length in the order of 1.5 mm. The couplers 6 are 2×2 50%–50% couplers. The conductor 50 have toroidal winding sections, each toroidal section is made of 2500 turns. Signals $P_{i2}$, $P_{O2}$, $P_{i1}$, and $P_{O1}$ are supplied to or provided by an electro-optical converter module (not shown). The reference current $I_{REF1}$ of one of the sensing units is nil whereas the reference current $I_{REF2}$ of the other sensing unit has an amplitude defined by the above equation. It is then possible to obtain two sensing units having orthogonal transfer functions. Because of that, it is possible to follow the evolution of the response of the sensing unit with respect to time, by counting fringes in a manner analogous to the one of a rotary encoder. Also, a significative improvement of the resolution and dynamic bandwidth of the measurement is obtained. With this technique, a constant sensitivity with respect to current is obtained.

The quadrature measurement technique of the current can be also done by means of a single sensing unit. In this case, the reference current should be switched at a frequency which is higher than the one of the current to be measured. This technique is known as temporal multiplexing of orthogonal transfer functions of the sensor.

In operation, with the embodiment shown in FIG. 10, the measurement method further comprises steps of:

g) encircling the electrical current I by means of a third loop portion 18 of a second single-mode birefringent waveguide 16, the second waveguide 16 having a linear birefringence and a circular birefringence, the circular birefringence and linear birefringence of the second waveguide 16 having respectively given orders of magnitude, the order of magnitude of the circular birefringence of the second waveguide 16 being equal or higher than the order of magnitude of the linear birefringence of the second waveguide 16;

h) generating a second light beam;

i) splitting the second light beam to launch two second counter-propagating light beams into respective ends of the second waveguide 16;

j) pseudo-depolarizing the two second counter-propagating light beams launched into the second waveguide 16 to convert each of the second counter-propagating light beams into a predetermined ratio of second useful and useless counter-propagating light signals;

k) inducing a bias phase difference between polarization components of the second counter-propagating light beams by circulating a current $I_{REF2}$ which is a reference current around a section of a fourth loop portion 52 of the second waveguide 16, the fourth loop portion 52 being in series with the third loop portion 18;

l) interfering the second useful counter-propagating light signals and second useless counter-propagating light signals to produce a second interfered light signal;

m) optically detecting a second light intensity of the second interfered light signal, whereby the second light intensity is also representative of the current I; and n) calculating the current I by means of the first and second light intensities with a quadrature technique.

In FIG. 10, there is shown a schematic view of a preferred embodiment of the present invention. This embodiment is for measuring the current in a high voltage station operating at 765 kV. Two sensing units are needed because this embodiment allows the measurement of current by means of the quadrature technique. It is possible to use only one secondary loop portion because the reference current $I_{REF1}$ is nil. But, in the present case, two secondary loop portions are used, to obtain redundancy. The reference current $I_{REF2}$ is set at one ampere DC and corresponds to the equation mentioned above. At least, four optical fibres must be included in the column of the insulator 58. Preferably, supplementary fibres should be mounted in case of fibre breakage.

Figure 11:
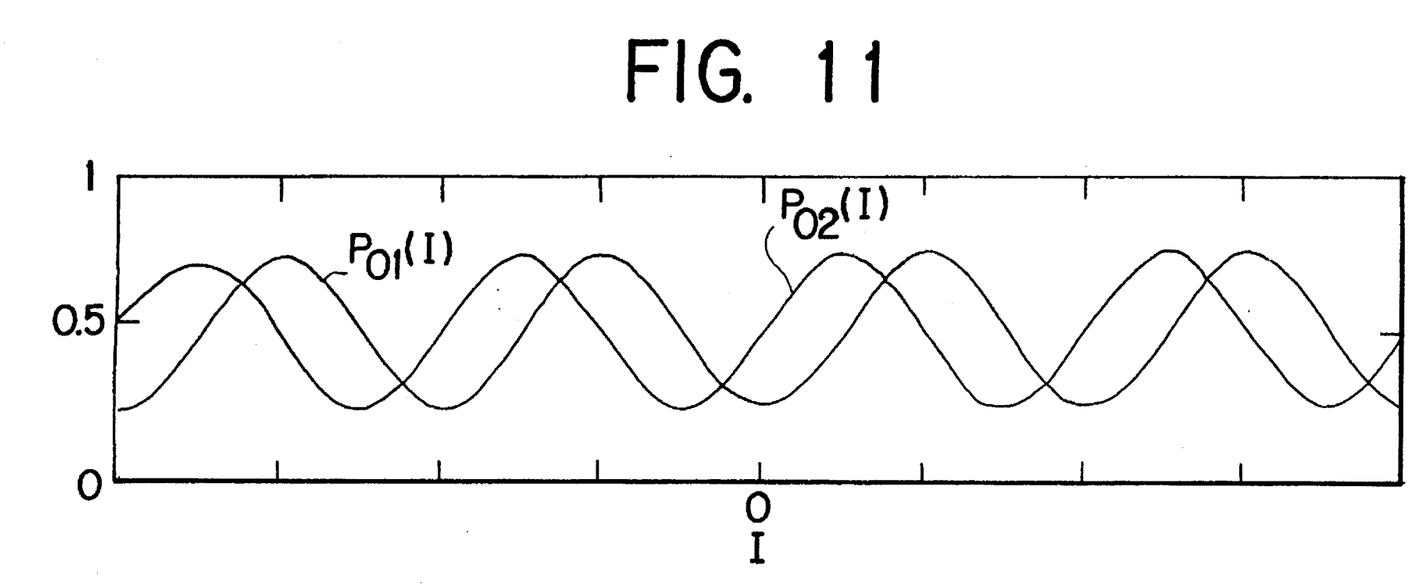
FIG. 11 is a diagram showing output signals in relation with the embodiment shown in FIG. 10.

Referring now to FIG. 11, there are shown the signals resulting from the two light intensities detected with respect to current I when $I_{REF1}$ is nil and where $I_{REF2}$ is set at 1 ampere DC. It has to be noted that the phase-shifting of the two transfer functions allows a measurement of the current by means of quadrature technique. In the present case, the period of these transfer functions is of 20 kA.

The use of a pseudo-depolarizer 8 combined with a conventional optical fibre for a gyroscope has been proposed in the publication "Magnetic Field Sensitivity of Depolarized Fiber Optic Gyros" VIII, SPIE, Vol. 1367, P. 81, 1990 of J. BLAKE. The configuration proposed by BLAKE would not be adequate for current sensing because it does not solve the problems relating to mechanical and temperature vibrations.

The interferometric current sensors shown in FIGS. 1, 7 and 10 have several advantages over the prior art. These sensors are not sensitive to temperature variations and mechanical vibrations. These sensors are very efficient, have a simple configuration. Because of that, the whole system has an excellent long term stability, can be manufactured at a low cost and can be easily mounted. As no precise adjustment of the optical fibre orientation is required, the sensor can be easily mounted around a conductor and spliced to the coupler. Because of that, it can be seen that the sensor can be mounted without the need of cutting the electrical conductor. Also, such an interferometric current sensor has a good sensitivity to current, a good precision, a wide dynamic range and a low weight.

The depolarizer mounted in the Sagnac loop is a pseudo-depolarizer and not a real depolarizer since a real depolarizer does not maintain phase information. The pseudo-depolarizer is preferably an optical fibre Lyot pseudoz-depolarizer. This pseudo-depolarizer must be designed in such a way that all the light is pseudo-depolarized. Narrower is the light spectrum of the source, longer is the optical fibre Lyot pseudo-depolarizer. Also, it is possible to use other pseudo-depolarizers such as the Cornu pseudo-depolarizer which pseudo-depolarizes the light no matter what is the spectral bandwidth. However, this latter type of pseudo-depolarizer is less convenient because it does not use an optical fibre.

The light source must have a spectrum which is sufficiently large to be pseudo-depolarized by the Lyot pseudo-depolarizer. However, this spectral bandwidth can be narrow if the pseudo-depolarizer that is used is more efficient than the Lyot pseudo-depolarizer.

In order to minimize the length of the Lyot pseudo-depolarizer, it is preferable to use a light source having a spectral bandwidth superior to 5 nm. For that, the source can be a laser source operating under the lasing threshold, or a light emitting diode.

The sensitivity to the Faraday effect is inversely proportional to the squared light wavelength. More the wavelength is short, more the Faraday rotation is important. For this reason, the fibre optic interferometric current sensor is generally based on a light source having a short wavelength. Preferably, the wavelength of the source is of 780 nm or 820 nm. Nevertheless, longer wavelength such as the one used in telecommunication because the transmission via the optical fibres is better and because more efficient and less expensive components have been developed should not be excluded. Thus, in certain applications, it could be advantageous to use a light source based on a wavelength of 1300 nm.

As it has been said above, the optical fibre used in the Sagnac loop should be of the high birefringent spun fibre type. The optical fibre guiding the light from the light source to the Sagnac interferometer should be of the single-mode type whereas the optical fibres guiding the light from the Sagnac interferometer to the optical detectors can be of the single-mode or multimode type.

Preferably, the coupler is a fused biconical taper coupler. This type of coupler is very stable and of relatively low cost. The coupler used in the embodiment shown in FIG. 1 is a 2×2 coupler which means that it has two pairs of input and output ports.

In every cases, the coupling ratio of the coupler must not be sensitive to light polarization, temperature variations or other phenomena.

EXPERIMENTAL RESULTS

The embodiment shown in FIG. 1 has been used to perform different experiments. For these experiments, the light source is an electroluminescent diode centered at 815 nm and having a spectral bandwidth of 40 nm. This source emits a light beam which is injected via a first 2×2 coupler 10 into the input port 1 of the second 2×2 coupler 6. This second coupler is a part of the Sagnac interferometer. The Sagnac loop is made of a Lyot pseudo-depolarizer 8 fused with a spun fibre winding mounted around an electrical conductor 12 where circulates a current I. The signals $P_1$ and $P_2$ such as defined above are detected respectively by means of detectors 20 and 22 which are coupled to port 9 of the injecting coupler 10 and to port 2 of the Sagnac coupler respectively. Each of the detectors 20 and 22 provides a signal in volt proportional to the received light intensity.

The pseudo-depolarizer comprises two high birefringent elliptical core fibre sections made by Corning [trademark], having respectively length of 5 m and 13 m. These sections are fused together so that the birefringence axes of the two fibre sections be rotated by 45° with one another.

The spun fibre is made from a fibre preform having an elliptical core providing an intrinsic birefringence having a beat length $L_P$ of about 15 mm. This fibre preform is spun during the drawing thereof at a rate of 620 RPM. The drawing speed of the fibre is of 7.6 m/min., which produces a spin pitch length equal to 12.3 mm. This fibre makes 52 turns around the conductor forming a 17 cm diameter coil.

Figure 4:
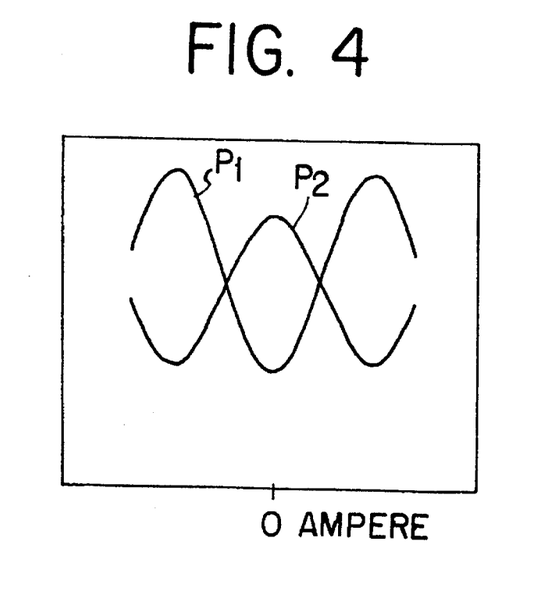
FIGS. 4, 5 and 6 are diagrams showing signals from experiment results in relation to the embodiment shown in FIG. 1.

Referring now to FIG. 4, there are shown signals $P_1$ and $P_2$ with respect to current I. The vertical axis is proportional to the light intensity and the horizontal axis is proportional to the current I. These signals remain stable even when the winding or the whole interferometric sensor assembly are subjected to violent mechanical vibrations.

A measure of the signal stability with respect to temperature has been done. In order to do that, the spun fibre winding has been placed inside a temperature controlled oven. Measurements of $P_1/P_0$ and $P_2/P_0$ have been taken for currents of 0 ampere and 4400 amperes within a temperature interval varying from 25° C. to 53° C. $P_1/P_0$ and $P_2/P_0$ are normalized with respect to average measurements.

Figure 5:
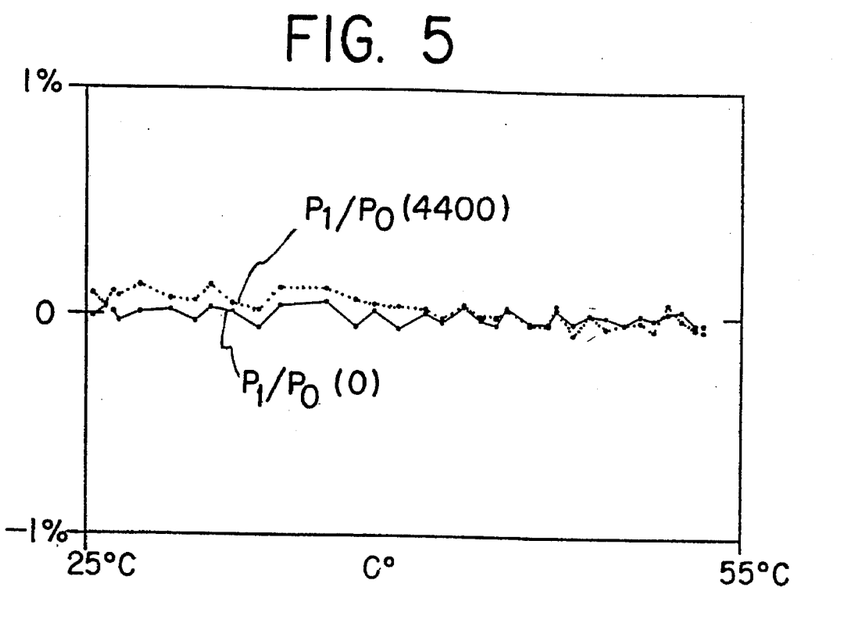

Referring now to FIG. 5, there is shown the variation of the ratio $P_1/P_0$ for the two values of current mentioned above with respect to temperature. The ratio is along the vertical axis and the temperature is along the horizontal axis.

Figure 6:
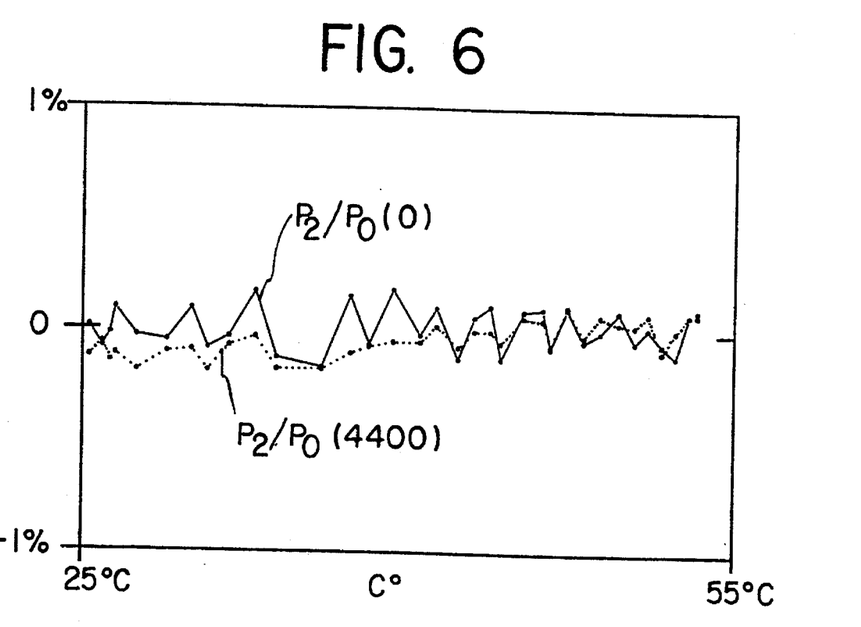

Referring now to FIG. 6, there is shown a similar diagram for the ration $P_2/P_0$. The ratio is along the vertical axis and the temperature is along the horizontal axis. The signals remain stable within ±0.2% along the whole range of temperatures.

Although the present invention has been explained hereinafter by way of preferred embodiments thereof, it should be pointed out that any modifications to these preferred embodiments, within the scope of the appended claims, are not deemed to change or alter the nature and scope of the present invention.

What is claimed is:

1. An interferometric current sensor for measuring a first electrical current, said sensor comprising:

a light source for generating a light beam;

a single mode birefringent waveguide having a linear birefringence and a circular birefringence, said circular and linear birefringences having respectively given orders of magnitude, the order of magnitude of said circular birefringence being equal or higher than the order of magnitude of said linear birefringence, said waveguide having a first loop portion for encircling said electrical current;

a beamsplitter having a first input port optically coupled to said light source, and second and third input/output ports optically coupled to ends of said waveguide for launching counter-propagating light beams into the respective ends of the waveguide and for receiving said counter-propagating light beams therefrom;

pseudo-depolarizer means for reducing sensitivity to at least one of mechanical vibrations and temperature variations, said pseudo-depolarizer means being optically coupled in series with said waveguide for converting each of said counter-propagating light beams into a predetermined ratio of useful counter-propagating light signals and useless counter-propagating light signals; and an optical detector optically coupled to the ends of said waveguide via said beamsplitter for detecting a light intensity, said light intensity resulting from an interference of useful counter-propagating light signals and useless counter-propagating light signals, whereby said light intensity is representative of said current.

2. An interferometric current sensor according to claim 1, wherein;

said beamsplitter has a fourth output port;

said optical detector comprises first and second detecting units respectively coupled to the ends of said waveguide via said beamsplitter, said second detecting unit being connected to said fourth output port for receiving light therefrom; and said first input port of said beamsplitter is a first input/output port;

said sensor further comprising an injection coupler for optically coupling said source and said first detecting unit to said beamsplitter, said injection coupler having an input port connected to said source, an output port connected to said first detecting unit and an input/output port connected to said first input/output port of said beamsplitter.

3. An interferometric current sensor according to claim 1, wherein:

said source is characterized by a spectral distribution having a central frequency equal to $v_o$ and a spectral frequency full-width equal to $\delta v$ at half maximum;

said light beam generated by said source has a coherence length $L_c$ equal to $c/\delta v$ where c is the velocity of light in vacuum; and said pseudo-depolarizer means is a Lyot depolarizer comprising:

a first highly birefringent fibre having a high birefringence $\Delta\beta_1$, a length $L_1$, polarization axes $P_1$ and $P_2$ and a depolarization length $L_{d1}$ defined by the following equation:

$$L_{d1} = \frac{c*L_1}{2\pi} \left( \frac{d\Delta\beta_1}{dv} \right) \bigg|_{v=v_0}$$

said depolarization length $L_{d1}$ being greater than $L_c$; and a second highly birefringent fibre having a high birefringence $\Delta\beta_2$, a length $L_2$, polarization axes $P_3$ and $P_4$ and a depolarization length $L_{d2}$ defined by the following equation:

$$L_{d2} = \frac{c*L_2}{2\pi} \left( \frac{d\Delta\beta_2}{dv} \right) \bigg|_{v=v_0}$$

said $L_{d2}$ being equal to or higher than said $2L_{d1}$, said first highly birefringent fibre having an end connected an end of said second highly birefringent fibre in such a manner that said polarization axes $P_1$ and $P_2$ are rotated of 45° from said polarization axes $P_3$ and $P_4$.

4. An interferometric current sensor according to claim 1, wherein:

said single mode birefringent waveguide is a spun fibre; and said beamsplitter with said single mode birefringent waveguide forms a Sagnac interferometer.

5. An interferometric current sensor for measuring an electrical current, comprising:

a light source for generating a light beam, said light source is characterized by a spectral distribution having a central frequency equal to $v_o$ and a spectral frequency full-width equal to $\delta v$ at half maximum, said light beam having a coherence length $L_c$ equal to $c/\delta v$ where c is the velocity of light in vacuum, said light source being an electroluminescent diode;

a single mode birefringent waveguide having a linear birefringence and a circular birefringence, said circular birefringence and linear birefringence having respectively given orders of magnitude, the order of magnitude of said circular birefringence being equal or higher than the order of magnitude of said linear birefringence, said waveguide having a portion for encircling said electrical current, said single mode birefringent waveguide being a spun fibre;

a beamsplitter having a first input port optically coupled to said light source, and second and third input/output ports optically coupled to ends of said waveguide for launching counter-propagating light beams into the respective ends of the waveguide and for receiving said counter-propagating light beams therefrom, said beamsplitter with said single mode birefringent waveguide forming a Sagnac interferometer;

pseudo-depolarizer means for reducing sensitivity to at least one of mechanical vibrations and temperature variations, said pseudo-depolarizer means being optically coupled in series with said waveguide for converting each of said counter-propagating light beams into a predetermined ratio of useful counter-propagating light signals and useless counter-propagating light signals, said pseudo-depolarizer means being a Lyot depolarizer comprising:

a first highly birefringent fibre having a high birefringence $\Delta\beta_1$, a length $L_1$, polarization axes $P_1$ and $P_2$, and a depolarization length $L_{d1}$ defined by the following equation:

$$L_{d1} = \frac{c*L_1}{2\pi} \left( \frac{d\Delta\beta_1}{dv} \right) \bigg|_{v=v_0}$$

said depolarization length $L_{d1}$ being greater than $L_c$; and a second highly birefringent fibre having a high birefringence $\Delta\beta_2$, a length $L_2$, polarization axes $P_3$ and $P_4$, and a depolarization length $L_{d2}$ defined by the following equation:

$$L_{d2} = \frac{c*L_2}{2\pi} \left( \frac{d\Delta\beta_2}{dv} \right) \bigg|_{v=v_0}$$

said $L_{d2}$ being equal to or higher than said $2L_{d1}$, said first highly birefringent fibre having an end connected to an end of said second highly birefringent fibre in such a manner that said polarization axes $P_1$ and $P_2$ are rotated at 45° from said polarization axes $P_3$ and $P_4$; and an optical detector optically coupled to the ends of said waveguide via said beamsplitter for detecting a light intensity, said light intensity resulting from an interference of useful counter-propagating light signals and useless counter-propagating light signals, whereby said light intensity is representative of said current.

6. An interferometric current sensor according to claim 2, wherein:

said source is characterized by a spectral distribution having a central frequency equal to $v_o$ and a spectral frequency full-width equal to $\delta v$ at half maximum;

said light beam generated by said source has a coherence length $L_c$ equal to $c/\delta v$ where c is the velocity of light in vacuum; and said pseudo-depolarizer means is a Lyot depolarizer comprising:

a first highly birefringent fibre having a high birefringence $\Delta\beta_1$, a length $L_1$, polarization axes $P_1$ and $P_2$, and a depolarization length $L_{d1}$ defined by the following equation:

$$L_{d1} = \frac{c*L_1}{2\pi} \left( \frac{d\Delta\beta_1}{dv} \right) \bigg|_{v=v_0}$$

said depolarization length $L_{d1}$ being greater than $L_c$; and a second highly birefringent fibre having a high birefringence $\Delta\beta_2$, a length $L_2$, polarization axes $P_3$ and $P_4$, and a depolarization length $L_{d2}$ defined by the following equation:

$$L_{d2} = \frac{c*L_2}{2\pi} \left( \frac{d\Delta\beta_2}{dv} \right) \bigg|_{v=v_0}$$

said $L_{d2}$ being equal to or higher than said $2L_{d1}$, said first highly birefringent fibre having an end connected to an end of said second highly birefringent fibre in such a manner that said polarization axes $P_1$ and $P_2$ are rotated of 45° from said polarization axes $P_3$ and $P_4$.

7. An interferometric current sensor according to claim 6, wherein:

said single mode birefringent waveguide is a spun fibre; and said beamsplitter with said single mode birefringent waveguide forms a Sagnac interferometer.

8. An interferometric current sensor according to claim 1, wherein:

said source is characterized by a spectral distribution having a central frequency equal to $v_o$ and a spectral frequency full-width equal 2500 gigahertz;

said light beam generated by said source has a coherence length $L_c$ equal to c/(2500 gigahertz) where c is the velocity of light in vacuum; and said pseudo-depolarizer means is a Lyot depolarizer comprising:

a first highly birefringent fibre having a high birefringence $\Delta\beta_1$, a length $L_1$, polarization axes $P_1$ and $P_2$, and a depolarization length $L_{d1}$ defined by the following equation:

$$L_{d1} = \frac{c*L_1}{2\pi} \left( \frac{d\Delta\beta_1}{dv} \right) \bigg|_{v=v_0}$$

said depolarization length $L_{d1}$ being greater than $L_c$; and a second highly birefringent fibre having a high birefringence $\Delta\beta_2$, a length $L_2$, polarization axes $P_3$ and $P_4$ and a depolarization length $L_{d2}$ defined by the following equation:

$$L_{d2} = \frac{c*L_2}{2\pi} \left( \frac{d\Delta\beta_2}{dv} \right) \bigg|_{v=v_0}$$

said $L_{d2}$ being equal to or higher than said $2L_{d1}$, said first highly birefringent fibre having an end connected to an end of said second highly birefringent fibre in such a manner that said polarization axes $P_1$ and $P_2$ are rotated of 45° from said polarization axes $P_3$ and $P_4$.

9. An interferometric current sensor according to claim 8, wherein said light beam generated by said source has substantially a wavelength of 780 nanometers or 820 nanometers.

10. An interferometric current sensor according to claim 1, further comprising an electrical conductor for inducing a reference phase difference between polarization components of said counter-propagating light beams by circulating a reference current around a section of a second loop portion of the waveguide, the second loop portion being in series with the first loop portion, whereby the light intensity is now also representative of polarity of the first electrical current.

11. An interferometric current sensor according to claim 10, wherein the first loop portion of the waveguide is for encircling a high voltage conductor through which circulates the first electrical current, the high voltage conductor being mounted at an upper end of a vertical insulator, the beamsplitter and the second loop portion being mounted at a lower end of said insulator.

12. An interferometric current sensor according to claim 10, further comprising:

a second light source for generating a second light beam;

a second single mode birefringent waveguide having a linear birefringence and a circular birefringence, said circular and linear birefringences of the second waveguide having respectively given orders of magnitude, the order of magnitude of the circular birefringence of the second waveguide being equal or higher than the order of magnitude of the linear birefringence of the second waveguide, the second waveguide having a third loop portion for encircling said electrical current;

a second beamsplitter having a first input port optically coupled to the second light source, and second and third input/output ports optically coupled to ends of the second waveguide for launching second counter-propagating lightbeams into the respective ends of the second waveguide and for receiving the second counter-propagating light beams therefrom;

a second pseudo-depolarizer means optically coupled in series with the second waveguide for converting each of the second counter-propagating light beams into a predetermined ratio of second useful counter-propagating light signals and second useless counter-propagating light signals;

a second optical detector optically coupled to the ends of the second waveguide via the second beamsplitter for detecting a second light intensity, the second light intensity resulting from an interference of the second useful counter-propagating light signals and second useless counter-propagating light signals, whereby the second light intensity is also representative of the first current; and a second electrical conductor for inducing a reference phase difference between polarization components of the second counter-propagating light beams by circulating a second reference current around a section of a fourth loop portion of the second waveguide, the fourth loop portion being in series with the third loop portion.

13. A method for measuring a first electrical current, said method comprising steps of:

a) encircling said first electrical current by means of a first loop portion of a single mode birefringent waveguide, said waveguide having a linear birefringence and a circular birefringence, said circular birefringence and linear birefringence having respectively given orders of magnitude, the order of magnitude of said circular birefringence being equal or higher than the order of magnitude of said linear birefringence;

b) generating a light beam;

c) splitting said light beam to launch two counter-propagating light beams into respective ends of said waveguide;

d) reducing the sensitivity to at least one of mechanical vibrations and temperature variations by pseudo-depolarizing said two counter-propagating light beams launched into said waveguide to convert each of said counter-propagating light beams into a predetermined ratio of useful and useless light signals;

e) interfering said useful counter-propagating light signals and useless counter-propagating light signals to produce an interfered light signal; and f) optically detecting a light intensity of said interfered light signal, whereby said light intensity is representative of said current.

14. A method according to claim 13, wherein;

said step (e) comprises the step of interfering said useful counter-propagating light signals and useless counter-propagating light signals to produce respectively two interfered light signals from said ends of said waveguide;

said step (f) comprises the step of optically detecting respectively light intensities of said interfered light signals, whereby said light intensities are representative of said current.

15. A method according to claim 13, wherein:

said step (b) comprises the step of generating a light beam characterized by a spectral distribution having a central frequency equal to $v_o$ and a spectral frequency full-width equal to $\delta v$ at half maximum, said light beam having a coherence length $L_c$ equal to $c/\delta v$ where c is the velocity of light in vacuum; and said step (d) is performed by means of a Lyot depolarizer comprising;

a first highly birefringent fibre having a high birefringence $\Delta \beta_1$, a length $L_1$, polarization axes $P_1$ and $P_2$, and a depolarization length $L_{d1}$ defined by the following equation:

$$L_{d1} = \frac{c * L_1}{2\pi} \left( \frac{d\Delta\beta_1}{dv} \right) \bigg|_{v=v_0}$$

said depolarization length $L_{d1}$ being greater than $L_c$; and a second highly birefringent fibre having a high birefringence $\Delta \beta_2$, a length $L_2$, polarization axes $P_3$ and $P_4$, and a depolarization length $L_{d2}$ defined by the following equation:

$$L_{d2} = \frac{c * L_2}{2\pi} \left( \frac{d\Delta\beta_2}{dv} \right) \bigg|_{v=v_0}$$

said $L_{d2}$ being equal to or higher than said $2L_{d1}$, said first highly birefringent fibre having an end connected to an end of said second highly birefringent fibre in such a manner that said polarization axes $P_1$ and $P_2$ are rotated of 45° from said polarization axes $P_3$ and $P_4$.

16. A method according to claim 13, wherein:

said single mode birefringent waveguide of said step (a) is a spun fibre; and said splitting of said step (c) is performed by means of a beamsplitter which forms a Sagnac interferometer with said spun fibre.

17. A method according to claim 13, further comprising, before step (e), the step of inducing a reference phase difference between polarization components of said counter-propagating light beams by circulating a second current which is a reference current around a section of a second loop portion of the waveguide, the second loop portion being in series with the first loop portion, whereby the light intensity detected in step (f) is now also representative of polarity of the first electrical current.

18. A method according to claim 17, further comprising steps of:

g) encircling the first electrical current by means of a third loop portion of a second single mode birefringent waveguide, the second waveguide having a linear birefringence and a circular birefringence, said circular birefringence and linear birefringence of the second waveguide having respectively given orders of magnitude, the order of magnitude of the circular birefringence of the second waveguide being equal or higher than the order of magnitude of the linear birefringence of the second waveguide;

h) generating a second light beam;

i) splitting the second light beam to launch two second counter-propagating light beams into respective ends of the second waveguide;

j) pseudo-depolarizing the two second counter-propagating light beams launched into the second waveguide to convert each of the second counter-propagating light beams into a predetermined ratio of second useful and useless counter-propagating light signals;

k) inducing a bias phase difference between polarization components of the second counter-propagating light beams by circulating a third current which is a reference current around a section of a fourth loop portion of the second waveguide, the fourth loop portion being in series with the third loop portion;

l) interfering the second useful counter-propagating light signals and second useless counter-propagating light signals to produce a second interfered light signal;

m) optically detecting a second light intensity of the second interfered light signal, whereby the second light intensity is also representative of the first current; and n) calculating the first current by means of the first and second light intensities with a quadrature technique.

19. A method according to claim 18, wherein the second current has a value of 1 ampere DC, and the third current has a value of 0 ampere.

* * * * *